United States Patent [19]

Reimann

[11] 3,778,530

[45] Dec. 11, 1973

[54] FLATPACK LEAD POSITIONING DEVICE

[76] Inventor: William George Reimann, 8163 Willow Glen Rd., Los Angeles, Calif. 90046

[22] Filed: July 5, 1972

[21] Appl. No.: 269,126

Related U.S. Application Data

[62] Division of Ser. No. 130,402, April 1, 1971, Pat. No. 3,700,443.

[52] U.S. Cl. ........... 174/68.5, 29/626, 317/101 CC, 339/17 C, 204/15

[51] Int. Cl. ............................................ H05k 3/34

[58] Field of Search .................................. 174/68.5; 317/101 CC, 101 C; 339/17 C, 275 B; 29/626

[56] References Cited

UNITED STATES PATENTS

| | | | |
|---|---|---|---|
| 2,954,540 | 9/1960 | Stupar | 317/101 CC X |
| 2,990,500 | 6/1961 | Mierendorf | 317/101 CC |
| 3,409,857 | 11/1968 | O'Neill et al. | 317/101 CP X |

*Primary Examiner*—Darrell L. Clay

*Attorney*—A. C. Rose et al.

[57] ABSTRACT

A printed circuit board for mounting integrated circuit and resistor network packages commonly referred to as flatpack components and a process for fabricating the circuit board. The printed circuit board has a conductive pattern of electrical connection pads for connecting to electrical leads from flatpack components and electrical conductors for connecting the pads to circuitry external to the board. A channel for receiving and aligning each electrical lead from a flatpack component is formed by printed circuit techniques. The surface layer of each channel is formed of solder which simplifies the process of electrically connecting flatpack leads and reduces errors occuring in the soldering process.

10 Claims, 25 Drawing Figures

FLATPACK LEAD POSITIONING DEVICE

This is a division of application Ser. No. 130,402, filed Apr. 1, 1971 now Pat. No. 3700443.

FIELD OF THE INVENTION

This invention pertains to the art of fabricating printed circuit boards. More particularly, it pertains to printed circuit boards for mounting integrated circuit components having a number of electrical leads.

DESCRIPTION OF THE PRIOR ART

Circuit boards of the prior art are commonly produced by aligning a flatpack in a predetermined position on a board, bonding it in place, centering electrical leads from the flatpack over corresponding connection pads and machine soldering each electrical lead to its corresponding connection pad. Electrical leads are joined to the connection pads by solder for a length of approximately 0.030 inch minimum. Each lead has a width dimension in the order of 0.220 inch. To avoid contact between adjacent electrical leads, flatpack leads must be centered axially along the connection pads with no side overhang. Centering the flatpack leads necessitates a time-consuming visual inspection. A printed circuit board which is defective because one or more electrical leads overhangs its connection pad or because of contact between adjacent electrical leads must be reworked. Such rework is time consuming and therefore costly.

SUMMARY OF THE INVENTION

The present invention overcomes the above disadvantages of the printed circuit boards of the prior art by providing a board wherein each electrical lead from a flatpack component is aligned and held in place for soldering by a channel on the corresponding connection pad adapted to receive the electrical lead. The channel is particularly useful for aligning flatpack leads which have a round cross section. Each connection pad comprises a channel bottom and walls formed by printed circuit techniques. The channel has a shape adapted for receiving and aligning a corresponding electrical lead from a flatpack. A surface layer of the channel is formed of solder to facilitate making an electrical connection between a lead from a flatpack and a conductor on the printed circuit board. The process for forming the printed circuit board comprises forming a two-dimensional conductive pattern of electrical connection pads and circuitry for connecting electronic components supported on an insulating sheet and then forming a pair of spaced conductive walls in juxtaposition on each two-dimensional area to form a channel for receiving and aligning an electrical lead from a flatpack. The channels provide the further advantage of containing flowing solder so that less solder is required to solder flatpack leads to the pads.

DESCRIPTION OF THE PREFERRED EMBODIMENT

Figure 1:
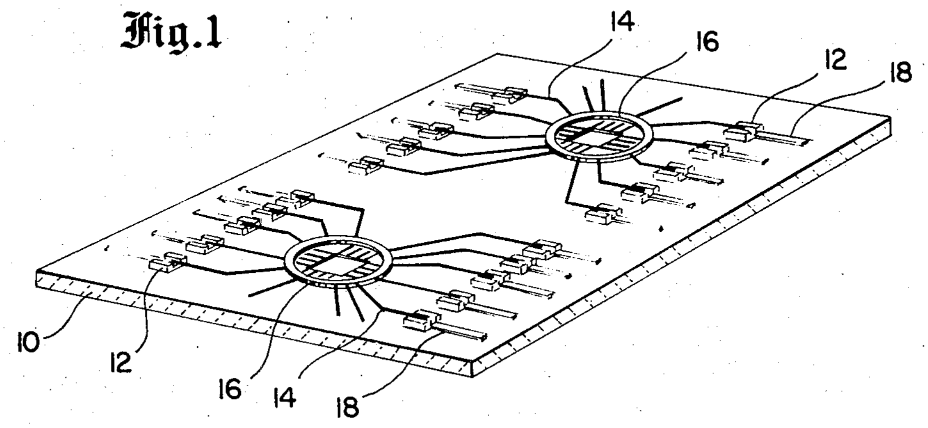
FIGS. 1 and 2 illustrate a typical printed circuit board made in accordance with the present invention.
Figure 2:
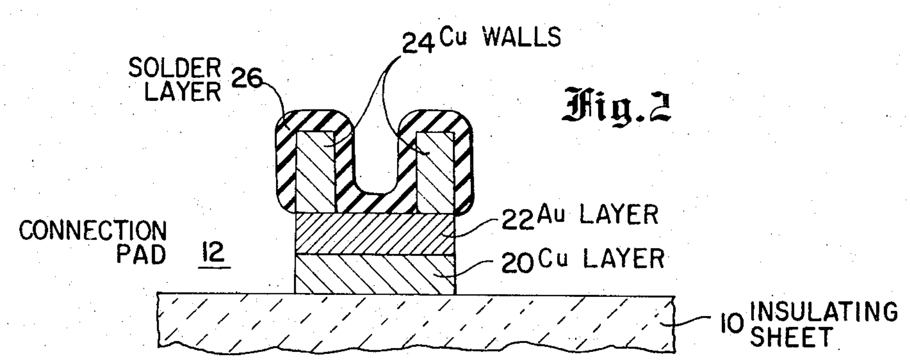

The preferred embodiment of the printed circuit board of the invention, shown in FIG. 1, comprises an insulating sheet 10, on which there are leads 14 from integrated circuit or flatpack components 16 and a plurality of electrical conductors 18 for establishing electrical connection between each connection pad 12 and circuitry external to the printed circuit board. The structure of each connection pad 12 may be more clearly seen in FIG. 2. Each connection pad 12 comprises a portion of layers 20, 22, 24 and 26. Copper layer 20 is supported on insulating sheet 10. Gold layer 22 covers copper layer 20. A pair of copper walls 24 and gold layer 22 form a channel in pad 12. Solder layer 26 covers the channel formed by walls 24 and gold layer 22. Solder layer 26 is adapted to receive and align an electrical lead 14. Machine soldering of electrical leads 14 to a corresponding connection pad 12 is facilitated because a surface layer of pad 12, i.e. layer 26 is made of solder in the form of a channel which holds and aligns a lead 14.

The preferred method of fabricating the printed circuit board shown in FIG. 1 is illustrated in FIGS. 3 through 12. It is to be understood that the drawings are intended to illustrate only the methods; accordingly, the dimensions in all the various figures are exaggerated and are not to be considered as being proportional.

Figure 3:
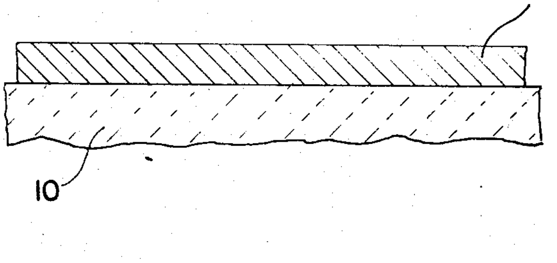
FIG. 3 is a cross-sectional view of a beginning step in the formation of the printed circuit board.

In the first step in producing the board, a conductive layer 20 of metal, shown in FIG. 3, is applied over insulating sheet 10 with a thickness of approximately 0.00135 inch. Layer 20 may be of a conducting metal such as, e.g., copper. Preferably, a copper-clad insulating sheet is utilized. Alternatively, copper may be deposited on a sheet of insulating material by using standard deposition techniques.

Figure 4:
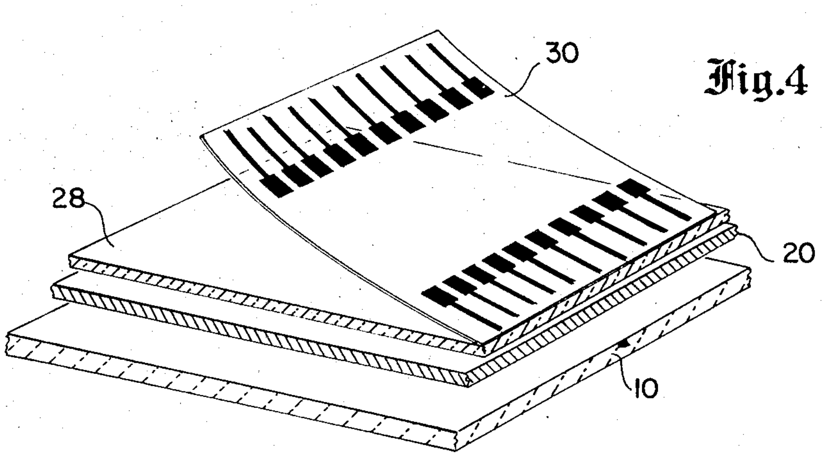
FIG. 4 represents an imaging step in the process.

Next a layer 28 of a first photoresist material, which may be a negative-acting resist such as Kodak KPR(2), is applied to the surface of metal layer 20 as shown in FIG. 4. Layer 28 of first photoresist material is applied by a conventional technique such as spraying the resist and then baking the resist until it is dry. Image film 30, which defines a desired pattern of electrical connection pads 12 and electrical conductors 18 by corresponding opaque areas of film, is positioned over layer 28 of first photoresist material. The resulting structure is then subjected to ultraviolet light from a collimated light source (not shown) such as a carbon arc or a mercury vapor lamp. Portions of layer 28 of photoresist material which lie under clear areas of image film 30 are hardened by the exposure to the ultraviolet radiation. The unexposed areas of photoresist material which lie under opaque portions of image film 30 remain unpolymerized, i.e., unhardened. Layer 28 of photoresist material is then developed in a standard solution. During the development of the photoresist material, the hardened portions of layer 28 remain on the surface of metal layer 20, while unhardened portions of it are dissolved and washed away. There remains, after development, exposed areas of metal layer 20 which correspond to a desired pattern for connection pads 12 and electrical conductors 18 as defined by image film 30.

Figure 5:
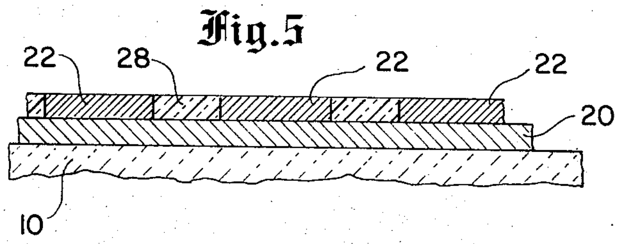
FIGS. 5 and 6 are cross-sectional views of intermediate steps in the process.

In the next step, an etchant-resistant conductive material, e.g., gold, is deposited on the now uncovered areas of metal layer 20. FIG. 5 illustrates gold layer 22 which forms a bottom portion of each connection pad 12 and electrical conductor 18. Gold layer 22 has a thickness of approximately 0.000050 inch.

Figure 6:
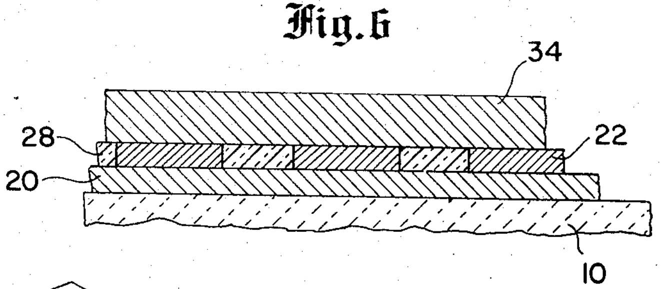

Proceeding now to the next step as illustrated in FIG. 6, metal layer 34 is applied over the surface of gold layer 22 and layer 28 of first photoresist material. Metal layer 34 may be of a conductive metal such as copper. Conventionally, the surface to be plated is first sensitized by depositing a very thin layer of copper to make the surface conductive. Then additional copper is electroplated to increase the thickness of metal layer 34 to approximately 0.002 inch.

Figure 7:
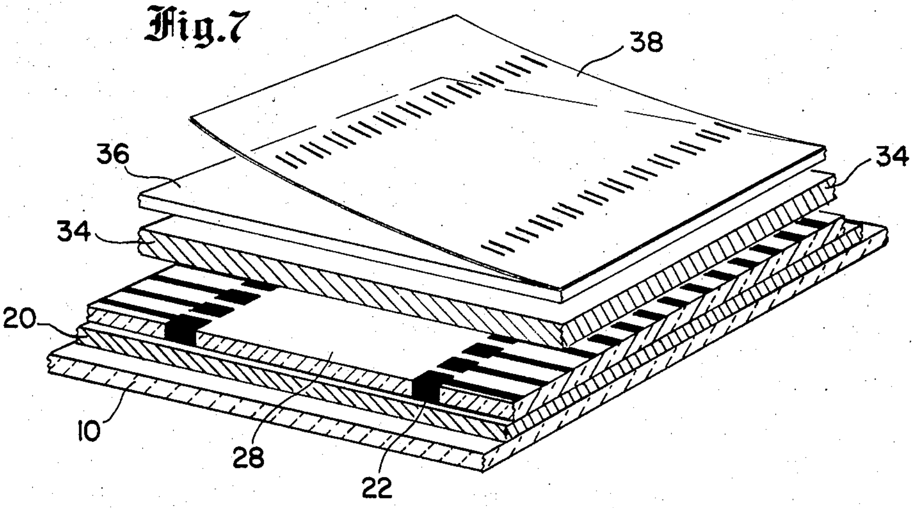
FIG. 7 represents a second imaging step in the process.

Portions of metal layer 34 are etched away to form a pair of three-dimensional walls in each connection pad 12. A layer 36 of a second photoresist material, such as positive-working Shipley's AZ111(4), is applied to the surface of metal layer 34 as shown in FIG. 7. The second photoresist material and the process relating to developing it is mutually independent and unaffected by the first photoresist material and its related process for development. Layer 36 of second photoresist material may be applied by spraying the resist material and then baking it until it is dry.

Figure 8:
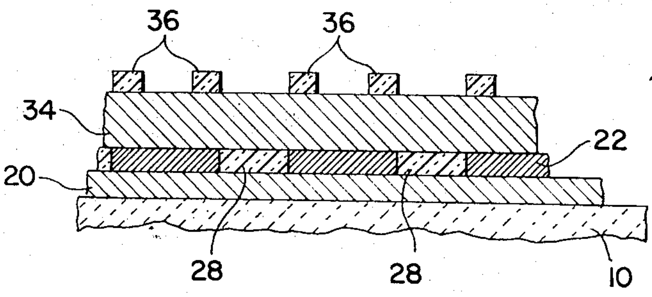
FIGS. 8, 9, 10, 11 and 12 are cross-sectional views of additional steps in the process.

Image film 38, which defines a desired pattern of three-dimensional walls, is positioned over layer 36 of second photoresist material. The second photoresist material may be of a type which is hardened in the process of applying it. It remains hardened until it is exposed to ultraviolet light. The structure is then subjected to ultraviolet light from a collimated light source (not shown). Areas of layer 36 under the clear portions of image film 38 are affected by exposure to the ultraviolet radiation while remaining areas of layer 36 under opaque portions of the film do not react. The opaque portions of image film 38 define the cross-section area of the three-dimensional walls. Layer 36 of second photoresist material is developed in a standard solution. During the developing of the resist, the unexposed portions of layer 36 remain on the surface of metal layer 34 while the exposed portions are dissolved and washed away as shown in FIG. 8.

Note that portions of metal layer 34 which will eventually comprise the tops of each pair of walls 24 in each connection pad 12 are covered by the remaining portions of layer 36 of second photoresist material. All other portions of metal layer 34 are exposed and will be removed by etching.

Figure 9:
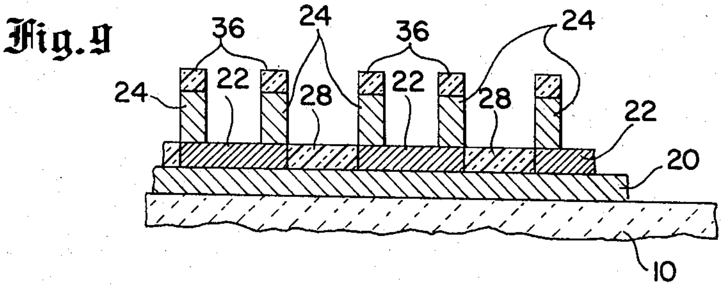

Referring to FIG. 9, etching of metal layer 34 produces a pair of walls 24 in each connection pad 12. Preferably, etching is accomplished by a process which will minimize undercut. For example, the Photo Engraver's Research Institute powderless etching technique may be used.

Each pair of walls 24 extends for the entire length of each connection pad 12. Gold layer 22, however, comprises not only the bottom portions of each connection pad 12 but, in addition, comprises areas defined by the pattern for electrical conductors 18. Portions of layer 36 of second photoresist material remain on the tops of each pair of walls 24.

The remaining portions of layer 36 of second photoresist material are next removed by immersing the structure in a suitable photoresist stripping solution.

Figure 10:
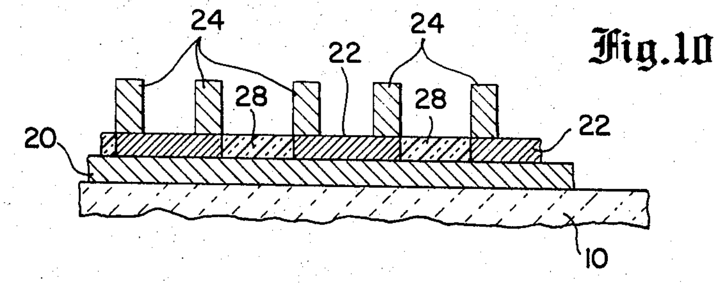

The structure resulting from this step is illustrated in FIG. 10. Remaining portions of layer 28 of first photoresist material are unaffected by the removal of layer 36. The surface of the board at this point comprises a pattern of electrical conductors 18, connection pads 12 and remaining portions of layer 28 of first photoresist material.

Figure 11:
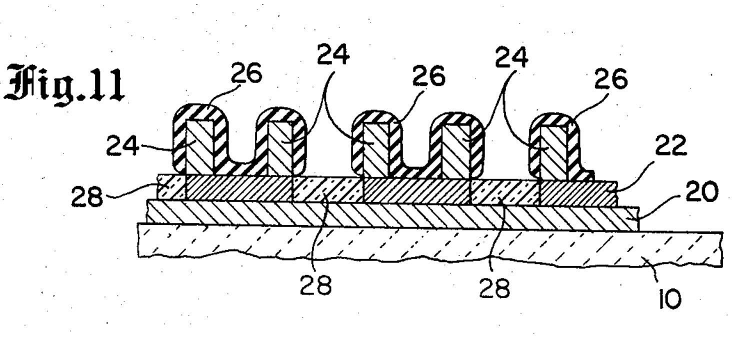

In the next step, illustrated in FIG. 11, a layer of an etchant-resistant conductive material 26 is applied over gold layer 22 and each pair of walls 24. Layer 26 also covers the pattern of electrical conductors 18 formed in layer 20 (not shown in FIG. 11). For example, a 0.001 inch layer of solder may be electroplated over layer 22 and walls 24. The general shape of each channel formed in each connection pad 12 is not altered by electroplating with solder. Each resulting channel in a connecting pad 12 is adapted to receive and align an electrical lead 14.

Figure 12:
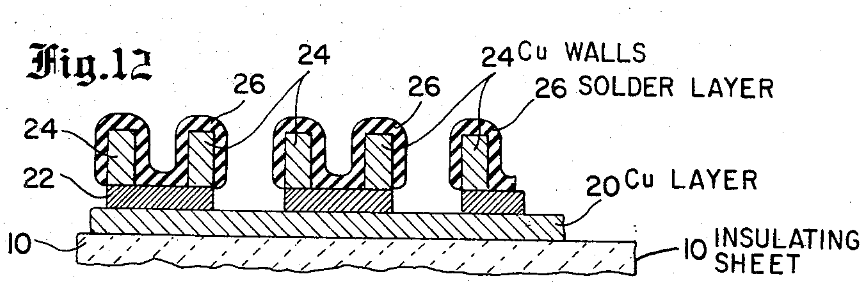

In the following step, the remaining areas of layer 28 of first photoresist are removed, thereby producing the structure illustrated in FIG. 12. The structure is immersed in a standard stripping solution to dissolve the photoresist. Removal of the remaining areas of layer 28 of first photoresist uncovers metal layer 28 except those areas of metal layer 28 covered by gold layer 22 in the pattern of connection pads 12 and electrical conductors 18.

In the last step, exposed areas of metal layer 28 are etched by immersing the structure in a conventional etching solution. Etching the structure does not affect surface areas covered by layer 26 of solder or layer 22 of gold. The structure is then rinsed in water and dried. Etching in this last step produces the structure illustrated in FIGS. 1 and 2.

ALTERNATIVE EMBODIMENT OF THE INVENTION

Figure 13:
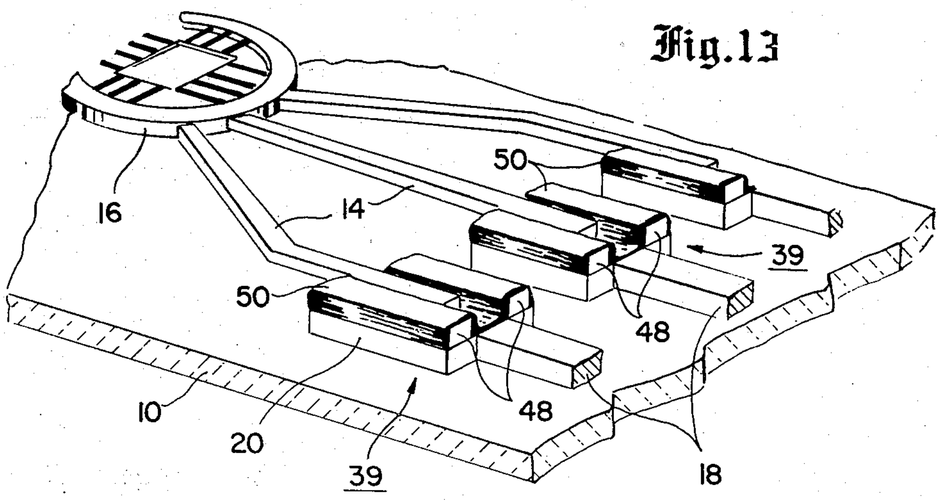
FIG. 13 is a top view of a portion of a printed circuit board having connection pads formed in accordance with the alternate method.

An alternative embodiment of the printed circuit board of the invention is illustrated in FIG. 13. Only representative connection pads are shown in FIG. 13. FIG. 1 includes a typical pattern of electrical conductors 18 and integrated circuit components 16. Referring again to FIG. 13, each electrical connection pad 39 comprises a portion of layer 20, a pair of conductive walls 48 in juxtaposition and surface layer 50. Layer 20 is of a conductive metal such as copper and is supported on an insulating sheet 10. Walls 48, layer 50 and a bottom portion from layer 20 form each depressed channel which is adapted to receive and align an electrical lead 14 from an integrated circuit component 16. Layer 50 is a solder layer covering the channel formed by layers 20 and 48 without altering the general shape of the channel. A method of fabricating the alternate embodiment of the printed circuit board is illustrated in FIGS. 14 through 25. Again, it is to be understood that the drawings are intended to illustrate only the method; accordingly, the dimensions in the various figures are not to be considered as being proportional.

Figure 14:
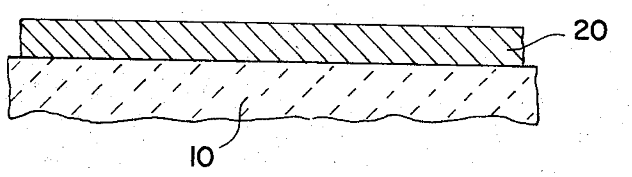
FIGS. 14 and 15 are cross-sectional views of beginning steps in the formation of the printed circuit board by the alternate method.

In the first step of the alternate process as illustrated in FIG. 14, conductive layer 20 of metal is applied over insulating sheet 10 in the same manner as described for the preferred method.

Figure 15:
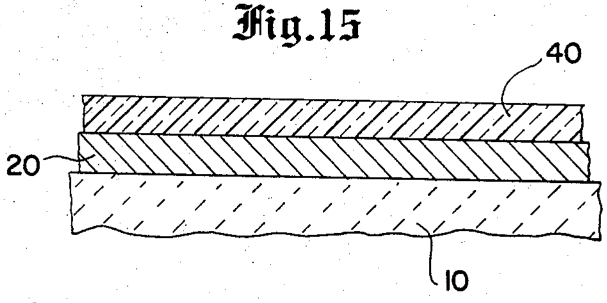
Figure 16:
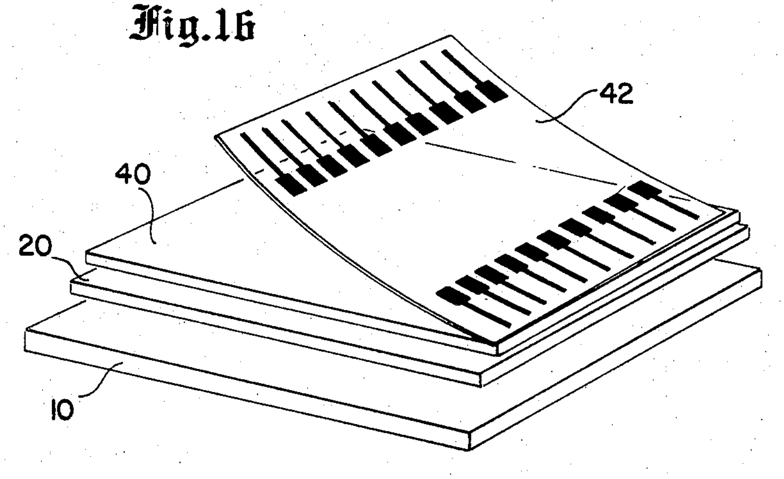
FIG. 16 represents an imaging step in the alternate process.
Figure 17:
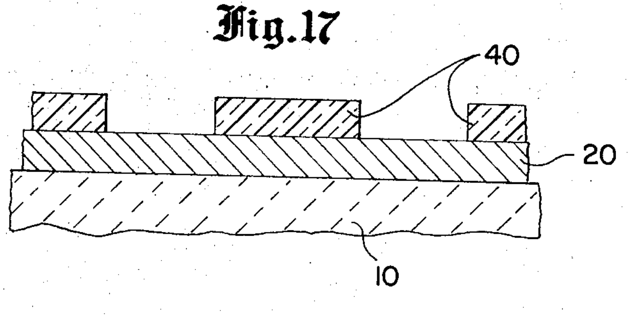
FIGS. 17 and 18 are cross-sectional views of intermediate steps in the alternate process.

Next, a layer 40 of a first photoresist material such as Kodak KPR(2) is applied to the surface of metal layer 20 as shown in FIG. 15. Layer 40 may be applied as discussed above. Image film 42, shown in FIG. 16, defines a desired pattern of electrical connection pads 39 and electrical conductors 18 by corresponding opaque areas of the film. The film is positioned over layer 40 of resist. Layer 40 of resist is exposed and developed in the same manner as discussed above for the preferred method. There remains, after developing layer 40 of first photoresist material, exposed areas of metal layer 20 which correspond to the desired pattern for connection pads 39 and electrical conductors 18 as defined by image film 42. The structure at this point is illustrated in FIG. 17.

Figure 18:
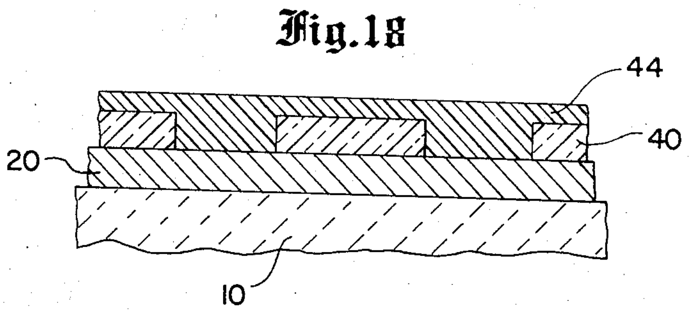

Next a layer 44 of second photoresist material, as shown in FIG. 18, is applied to the surface of the structure. For example, a negative-acting photoresist such as Du Pont's RISTON may be utilized as the second photoresist material. The second resist and the process relating to its development is mutually independent and unaffected by the first resist and its related process. Layer 46 of second photoresist is applied in a conventional manner as briefly described above.

Figure 19:
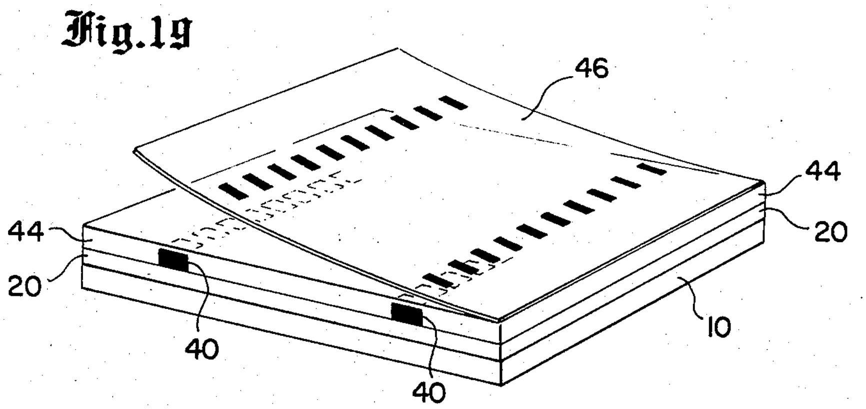
FIG. 19 represents a second imaging step in the alternate process.
Figure 20:
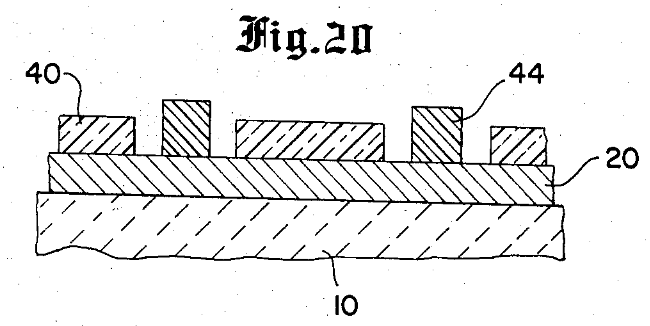
FIGS. 20, 21, 22, 23, 24 and 25 are cross-sectional views of additional steps in the alternate process.

As shown in FIG. 19, image film 46 defines a desired pattern of channel bottoms for connection pads 39. The film is positioned over layer 44 of second photoresist material. The second photoresist is not hardened in the process of applying it. The structure is subjected to ultraviolet light from a collimated light source (not shown). Areas of layer 44 under the clear portions of image film 46 are hardened by exposure to the ultraviolet radiation. The remaining areas of layer 44 under opaque portions of image film 46, which define tha pattern of channels, are not exposed to the radiation and, therefore, remain unhardened. Layer 44 of second photoresist is then developed in a conventional developing solution. During the developing of the second photoresist, the exposed portions of layer 44 remain on the surface of the structure, while the unexposed portions are dissolved and washed away as shown in FIG. 20.

Figure 21:
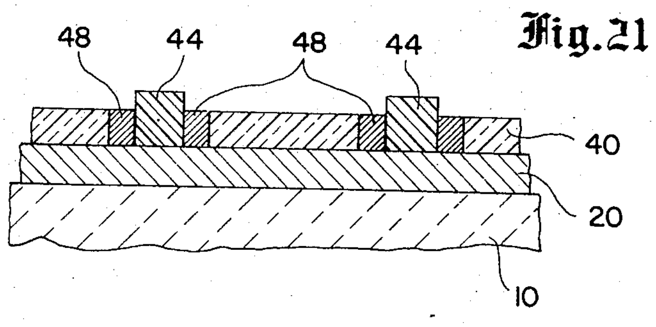

Proceeding now to the next step, metal layer 48 is applied by plating over the exposed areas of metal layer 20 to form the conductive walls of each connection pad 39. Metal layer 48 may be of a conductive metal such as copper and has a thickness of approximately 0.002 inch. FIG. 21 illustrates a cross section of the channels formed by a metal layer 48 and metal layer 20. At this point each conductive channel is filled with a portion of the remaining layer 44 of second photoresist material.

Figure 22:
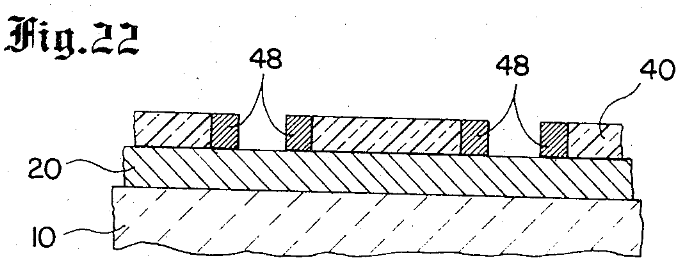

The remaining areas of layer 44 of resist are removed by immersing the structure in a standard stripping solution to produce the configuration illustrated in FIG. 22.

Figure 23:
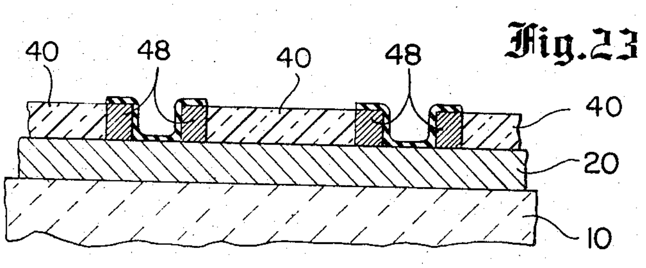

In the next step, illustrated in FIG. 23, a layer 50 of a conductive metal that is etchant resistant is applied over metal layer 48 and metal layer 20. For example, a 0.001 inch layer of solder may be electroplated over layers 48 and the exposed portions of layer 20. The general shape of each channel formed by metal layers 48 and 20 is not altered by electroplating layer 50 of solder. Each resulting channel is adapted to receive and align an electrical lead 14 from an integrated circuit component 16. It should be noted that because metal layer 20 was exposed in the desired pattern of conductors 18 and pads 39, the resulting layer 50 of solder is plated in this same pattern.

Figure 24:
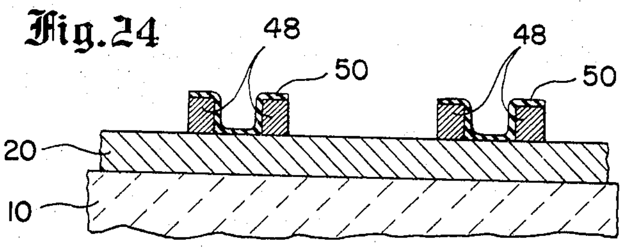
Figure 25:
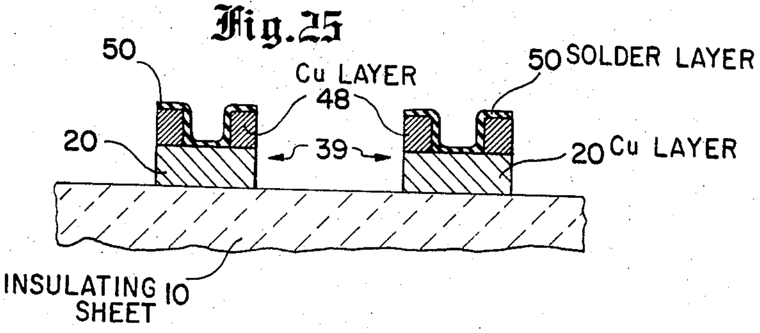

In the following step, the remaining areas of layer 40 of first photoresist material are removed to produce the structure illustrated in FIG. 24. The structure may be immersed in a standard solution to dissolve the resist. Removal of the remaining areas of layer 40 of resist uncovers metal layer 20 except those areas of layer 20 covered by layer 50 of solder and layer 48 of copper.

In the final step of the alternate process, the exposed areas of metal layer 20 are etched by immersing the structure in a standard etching solution. Etching the structure in ferric chloride does not affect surface areas covered by layer 50 of solder. The structure is then rinsed in water and dried. Etching portions of metal layer 20 produce the structure illustrated in FIGS. 13 and 25.

It is to be understood that the above-described arrangements are illustrative of the application of the principles of the invention. Other arrangements may be devised by those skilled in the art without departing from the spirit and scope of the invention. Thus, by way of example and not of limitation, other known printed circuit board techniques may be employed in the formation of the pattern of conductors on the surface of the printed circuit boards. Other processes, such as electroless metal transfer, metal spraying, or the like, may be employed to build up layers of conductive material from the single or multilayer insulating base sheets. The particular dimensions of the conductive layers will depend on the size of the components in the mechanical stresses to be encountered, and will obviously vary from those given hereinabove in accordance with different circuit board requirements. Accordingly, from the foregoing remarks, it is understood that the present invention is to be limited only by the spirit and scope or the appended claims.

I claim:

1. A connection pad for an electrical lead comprising:

a. an electrically nonconductive base supporting the connection pad, b. an electrically conductive laminated base having at least first and second laminae, said first lamina connected to said base, c. first and second electrically conductive walls formed on said second lamina in a juxtapositional and spaced-apart relationship, said juxtaposed walls and exposed second lamina therebetween developing a channel, and d. an electrically conductive solder layer both covering said walls and said exposed second lamina therebetween and complementing said channel thereby developing an electrical lead receiving and aligning channel for the desired electrical lead connection.

2. The connection pad of claim 1 in which said first laminae is a layer of electrically conductive metal.

3. The connection pad of claim 2 in which said metal is copper.

4. The connection pad of claim 1 in which said second laminae is a layer of electrically conductive metal.

5. The conneciton pad of claim 4 in which said metal is gold.

6. The connection pad of claim 4 in which said metal is copper.

7. The connection pad of claim 4 in which said metal is etchant-resistant.

8. The connection pad of claim 1 in which said walls are electrically conductive metal.

9. The connection pad of claim 8 in which said metal is copper.

10. The connection pad of claim 1 in which said second laminae extends outwardly from the connection pad and develops an electrical conductor in electrical continuity with the electrical lead.

* * * * *